United States Patent [19]

Costigan

[11] Patent Number: 4,901,135
[45] Date of Patent: Feb. 13, 1990

[54] HERMETICALLY SEALED HOUSING WITH WELDING SEAL

[75] Inventor: Jack P. Costigan, Mountaintop, Pa.
[73] Assignee: General Electric Company, Somerville, N.J.
[21] Appl. No.: 232,197
[22] Filed: Aug. 15, 1988
[51] Int. Cl.[4] ..................... H01L 23/02; H01L 23/10
[52] U.S. Cl. ......................................... 357/74; 357/84; 174/52.5; 219/93; 220/67; 220/DIG. 29
[58] Field of Search .................. 357/74, 84; 174/52.5; 219/93; 220/67, DIG. 29

[56] References Cited

U.S. PATENT DOCUMENTS

| | | | |
|---|---|---|---|
| 2,086,985 | 7/1937 | Mitchell | 220/67 |
| 2,184,939 | 12/1939 | Green | 220/67 |
| 2,796,563 | 6/1957 | Ebers et al. | 357/74 |
| 2,975,928 | 3/1961 | Roovers | 357/74 |
| 3,962,662 | 6/1976 | Bennett | 174/52.5 |

Primary Examiner—Andrew J. James
Assistant Examiner—Jerome Jackson, Jr.
Attorney, Agent, or Firm—K. R. Glick

[57] ABSTRACT

A hermetically sealed housing for a solid state device or the like includes a metal header having a mounting surface and a metal cap mounted on the header and over the mounting surface. The cap includes a cup-shaped portion and a flange extending radially outwardly from the rim of the cup-shaped portion. A weld ring projects from a surface of the flange toward the header mounting surface and is welded to the mounting surface. A second ring projects from the surface of the flange and is spaced radially inwardly from the weld ring. The second ring is shorter than the weld ring so that it preferably just contacts the mounting surface of the header. The second ring captures any metal particles splashed from the weld ring during the welding of the cap to the header and thereby minimizes particle induced noise.

9 Claims, 1 Drawing Sheet

HERMETICALLY SEALED HOUSING WITH WELDING SEAL

FIELD OF THE INVENTION

The present invention relates to a hermetically sealed housing, particularly for a solid state device. More particularly, the present invention relates to a metal cap for a welded hermetically sealed housing which prevents or minimizes undesired particles from entering the housing when the cap is welded to a header.

BACKGROUND OF THE INVENTION

Many solid state devices, such as diodes, transistors and the like, are encapsulated in a hermetically sealed housing. One type of such a housing includes a metal header on which the solid state device is mounted, and a metal cup-shaped cap fitting over the header and the solid state device and welded to the header. The cap generally includes a flange extending radially outwardly from the rim of the cap and having a weld ring projecting from the surface of the flange toward the header. The cap is mounted on the header by placing the flange over the surface of the header with the weld ring contacting the surface of the header. Welding electrodes are placed on opposite sides of the cap flange and header, and the flange and header are squeezed between the electrodes as a current is provided therethrough. The current causes the weld ring to heat up so that the weld ring melts and under the pressure applied by the electrodes welds to the header. This forms a hermetic seal between the flange of the cap and the header.

A problem with this type of welded structure is that the heating of the weld ring to form the weld also results in the formation of an uncontrolled splashing of small metal particles which become trapped in the housing. These particles can interfere with the proper operation of the solid state device in that they can cause particle induced noise. Although testing for particle induced noise was once required only for high reliability solid state devices, it has more recently been a complaint by many other users of the solid state devices. Therefore, it would be desirable to have a welded metal housing which minimizes, if not eliminates, the metal particles so as to greatly reduce the particle induced noise problem.

SUMMARY OF THE INVENTION

A cup-shaped metal cap adapted to be welded to a metal header to form a hermetically sealed housing has a flange extending radially outwardly from its rim, a weld ring projecting from a surface of the flange, and a second ring projecting from the surface of the flange radially inwardly of and spaced from the weld ring. When the cap is welded to the header, the second ring catches any particles from the weld ring and holds them between the second ring and the weld ring so as to prevent the particles from entering the housing.

DETAILED DESCRIPTION OF THE PREFERRED EMBODIMENT

Figure 1:
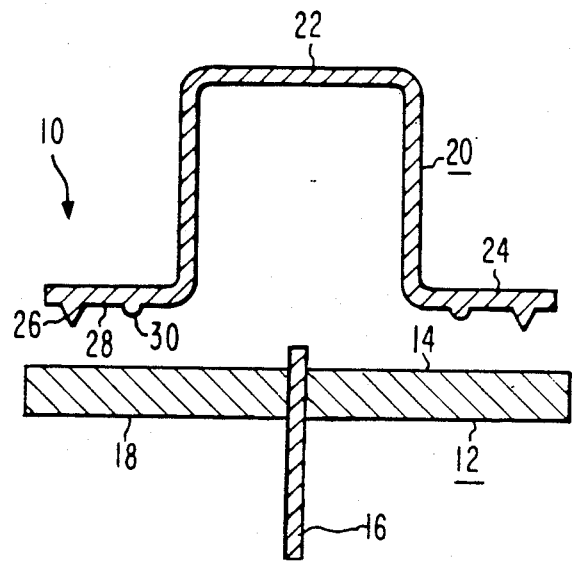
FIG. 1 is an exploded sectional view of the housing of the present invention.

Referring to FIG. 1 of the drawings, a hermetic housing of the present invention is generally designated as 10. The housing 10 includes a metal header 12 having a mounting surface 14 and at least one terminal 16 extending through the header 12 and projecting from the surface 18 of the header 12 opposite to the mounting surface 14. A metal cap 20 is over the mounting surface 14 of the header 12. The cap 20 has a cup-shaped portion 22 and a flange 24 extending radially outwardly from the rim of the cup shaped portion 22. A substantially V-shaped weld ring 26 projects from a surface 28 of the flange 24 adjacent and along the outer edge of the flange 24 and toward the header 12. The angle of the apex of the weld ring 26 is about 84 degrees. A second ring 30 having a rounded surface projects from the surface 28 of the flange 24 in the same direction as the weld ring 26. The second ring 30 is spaced radially inwardly from the weld ring 26 and is shorter than the weld ring 26 so that it does not project beyond the weld ring 26. The weld ring 26 should be about 0.006 inch longer than the second ring 30.

Figure 2:
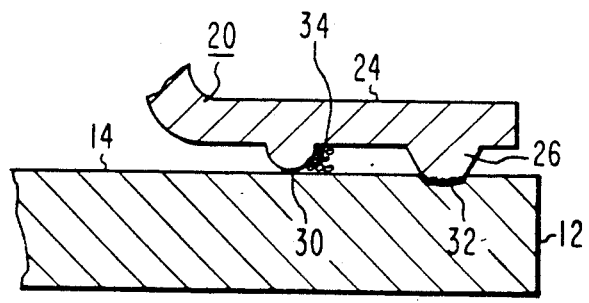
FIG. 2 is a sectional view of a portion of the housing with the cap welded to the header.

When the cap 20 is welded to the header 12, the cap 20 is placed over the header surface 14 with the weld ring 26 contacting the header surface 14. Since the second ring 30 is shorter than the weld ring 26, it does not contact the header surface 14. Thus, when a current is passed through the flange 24 and the header 12 by the welding electrodes, the current only passes through the weld ring 26. This heats the weld ring 26 until it melts forming a weld 32 between the weld ring 26 and the header 12 as shown in FIG. 2. As the weld ring 26 melts, the pressure applied by the welding electrodes moves the flange 24 closer to the header surface 14 so as to move the second ring 30 into very close proximity to the header surface 14. Preferably, the second ring 30 is moved to just contact the header surface 14. Thus, any metal particles 34 splashed from the molten weld ring 26 will contact the second ring 30. The particles 34 are most often hot enough at the moment they make contact with the second ring 30 to attach themselves to the cooler second ring 30. In the event that the particles 34 do not attach themselves to the second ring 30 they are none-the-less captured in the space between the second ring 30 and the weld ring 26. Thus, the second ring 30 prevents the particles 34 from entering the cup-shaped portion 22 of the cap and from contacting the solid state device therein. The radial distance between the second ring 30 and the weld ring 26 is made small enough, preferably about 0.010 inch, to reduce any significant particle movement. This greatly reduces, if not eliminating, any particle induced noise.

Thus, there is provided by the present invention a welded hermetically sealed housing for a solid state device or the like in which a second ring is provided on the flange of the cup-shaped cap radially inwardly of the weld ring to capture any metal particles splashed from the weld ring during the welding of the cap to the header. This prevents the metal particles from entering the housing and/confines them to a small space so as to minimize, or eliminate, any particle induced noise.

I claim:

1. In a hermetically sealed housing having a cup-shaped metal cup with a flange extending radially outwardly from the rim of the cup and a weld ring projecting from a surface of the flange, the improvement comprising:

a second ring projecting from said surface of the cap flange in the same direction as the weld ring, said second ring being spaced radially inwardly from the weld ring and projecting a shorter distance from the flange surface than the weld ring.

2. A housing in accordance with claim 1 in which the weld ring and the second ring project from the flange in the direction away from the cap.

3. A housing in accordance with claim 2 in which the weld ring extends about 0.006 inch beyond the second ring.

4. A housing in accordance with claim 3 in which the radial spacing between the weld ring and the second ring is about 0.010 inch.

5. A housing in accordance with claim 2 in which the weld ring is substantially V-shaped and the second ring has a rounded surface.

6. A housing in accordance with claim 5 in which the angle of the apex of the weld ring is about 84 degrees.

7. A hermetically sealed housing for a solid state device or the like comprising:

a metal header having a mounting surface; and a metal cap having a cup-shaped portion, a flange extending radially outwardly from the rim of the cup-shaped portion, a weld ring projecting from a surface of the flange and a second ring projecting from said surface of the flange in the same direction as the weld ring and spaced radially inwardly from the weld ring, the second ring projecting from the surface of the flange a shorter distance than the weld ring;

said cap being mounted over the mounting surface of the header with the weld ring being seated against and welded to the mounting surface of the header and the second ring being in close proximity to the header mounting surface to capture metal particles splashed from the weld ring between the second ring and the weld ring.

8. A housing in accordance with claim 7 in which the second ring just contacts the header mounting surface.

9. A housing in accordance with claim 7 in which the second ring has a rounded surface.

* * * * *